US012327735B2

(12) United States Patent
Lee et al.

(10) Patent No.: US 12,327,735 B2
(45) Date of Patent: Jun. 10, 2025

(54) APPARATUS AND METHOD FOR PROCESSING SUBSTRATE

(71) Applicant: SEMES CO., LTD., Chungcheongnam-do (KR)

(72) Inventors: Seong Gil Lee, Gyeonggi-do (KR); Sehoon Oh, Chungcheongnam-do (KR); Dong Sub Oh, Busan (KR); Ji-Hwan Lee, Gyeonggi-do (KR); Dong-Hun Kim, Seoul (KR); Wan Jae Park, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 113 days.

(21) Appl. No.: 16/918,212

(22) Filed: Jul. 1, 2020

(65) Prior Publication Data

US 2021/0013049 A1   Jan. 14, 2021

(30) Foreign Application Priority Data

Jul. 8, 2019   (KR) .......................... 10-2019-0082207

(51) Int. Cl.
*H01L 21/32*   (2006.01)
*H01J 37/32*   (2006.01)
(Continued)

(52) U.S. Cl.
CPC ...... *H01L 21/32137* (2013.01); *H01J 37/321* (2013.01); *H01J 37/3244* (2013.01);
(Continued)

(58) Field of Classification Search
USPC .................................................. 156/345.33
See application file for complete search history.

(56) References Cited

U.S. PATENT DOCUMENTS

| 5,744,049 A | 4/1998 | Hills et al. |
| 8,173,547 B2 | 5/2012 | Winniczek et al. |

(Continued)

FOREIGN PATENT DOCUMENTS

| CN | 101097864 A | 1/2008 |
| CN | 101097865 A1 | 1/2008 |

(Continued)

OTHER PUBLICATIONS

Machine Translation WO2019107728, Kim et I (Year: 2019).*

(Continued)

*Primary Examiner* — Ram N Kackar
(74) *Attorney, Agent, or Firm* — Buchanan Ingersoll & Rooney

(57) ABSTRACT

An apparatus and method for processing a substrate using plasma, which has high plasma stability and process reproducibility, is provided. The method includes providing an apparatus for processing a substrate comprising a plasma generating region and a process region separate from the plasma generating region, placing the substrate including a silicon layer and an oxide layer in the process region, forming a hydrogen atmosphere in the process region by providing a hydrogen-based gas to the process region without passing through the plasma generating region, generating plasma by providing a fluorine-based gas to the plasma generating region, and providing the generated plasma to the process region to selectively remove the silicon layer compared to the oxide layer.

8 Claims, 6 Drawing Sheets

(51) Int. Cl.
  *H01L 21/3213* (2006.01)
  *H01L 21/67* (2006.01)
(52) U.S. Cl.
  CPC .. *H01J 37/32724* (2013.01); *H01L 21/67069* (2013.01); *H01J 2237/334* (2013.01)

(56) References Cited

U.S. PATENT DOCUMENTS

| | | | |
|---|---|---|---|
| 9,023,732 B2 | 5/2015 | Wang et al. | |
| 9,093,371 B2 | 7/2015 | Wang et al. | |
| 9,153,442 B2 | 10/2015 | Wang et al. | |
| 9,184,055 B2 | 10/2015 | Wang et al. | |
| 9,449,850 B2 | 9/2016 | Wang et al. | |
| 9,659,792 B2 | 5/2017 | Wang et al. | |
| 9,704,723 B2 | 7/2017 | Wang et al. | |
| 9,865,471 B2 | 1/2018 | Shimoda et al. | |
| 9,991,134 B2 | 6/2018 | Wang et al. | |
| 2014/0099794 A1* | 4/2014 | Ingle | H01J 37/32 156/345.35 |
| 2014/0227881 A1* | 8/2014 | Lubomirsky | C23C 16/54 156/345.35 |
| 2014/0262038 A1* | 9/2014 | Wang | H01L 21/32136 156/345.35 |
| 2014/0271097 A1 | 9/2014 | Wang et al. | |
| 2014/0273488 A1 | 9/2014 | Wang et al. | |
| 2020/0006079 A1* | 1/2020 | Miyoshi | H01L 21/67248 |

FOREIGN PATENT DOCUMENTS

| | | |
|---|---|---|
| CN | 102915940 A | 2/2013 |
| KR | 100345022 B1 | 11/2002 |
| KR | 20110084408 A | 7/2011 |
| KR | 20160129769 A | 11/2016 |
| WO | 2019107728 A1 | 6/2019 |

OTHER PUBLICATIONS

Korean Office Action issued in Korean Application No. 10-2019-0082207, dated Oct. 6, 2020, 4 pages.

Chinese Office Action for Application No. 202010638699.X, dated Nov. 24, 2023 with translation, 13 pages.

\* cited by examiner

[FIG. 1]
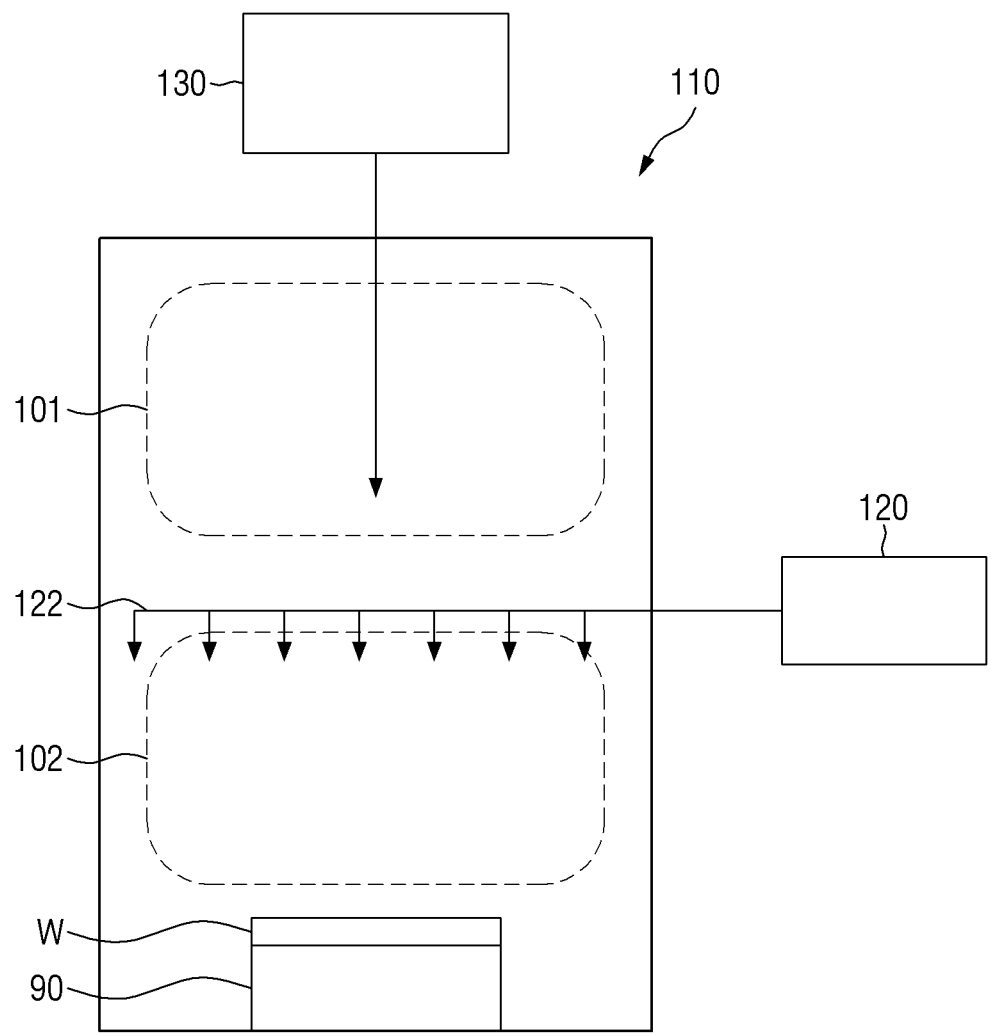

[FIG. 2]
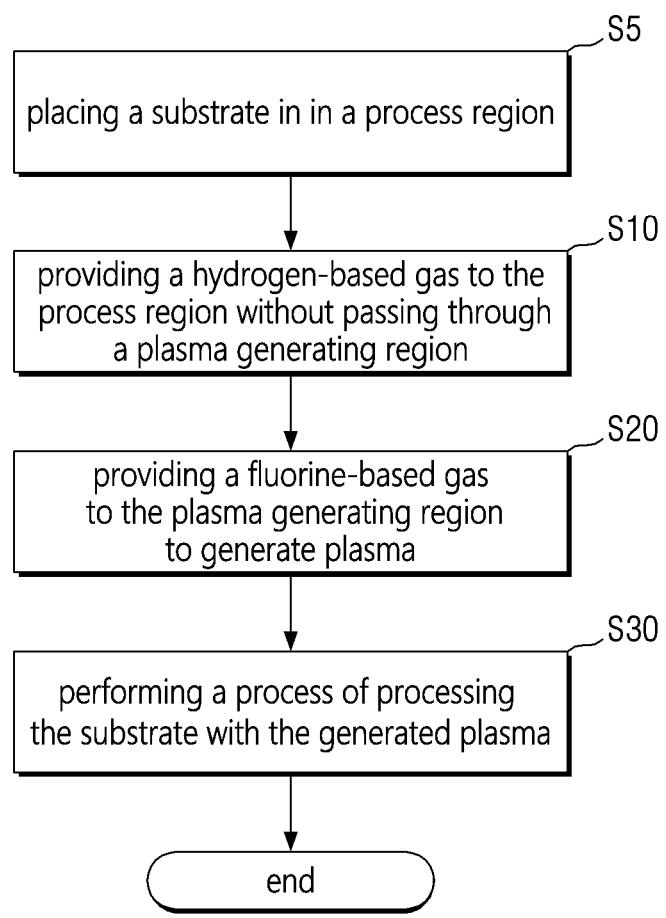

[FIG. 3]
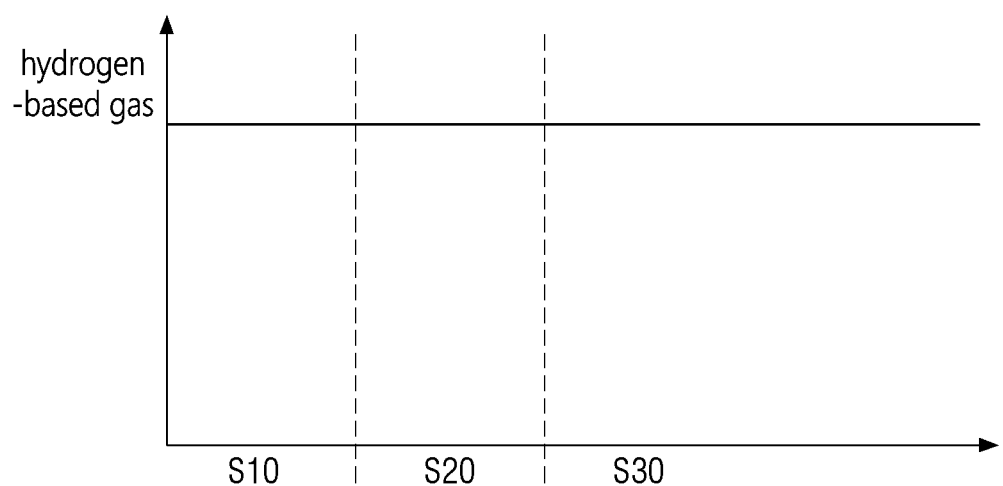

[FIG. 4]
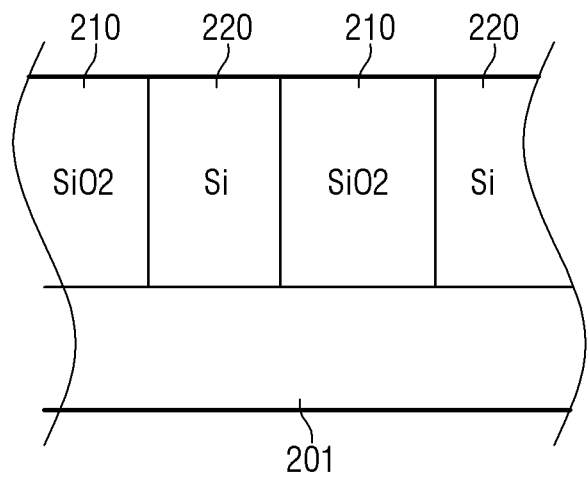

[FIG. 5]
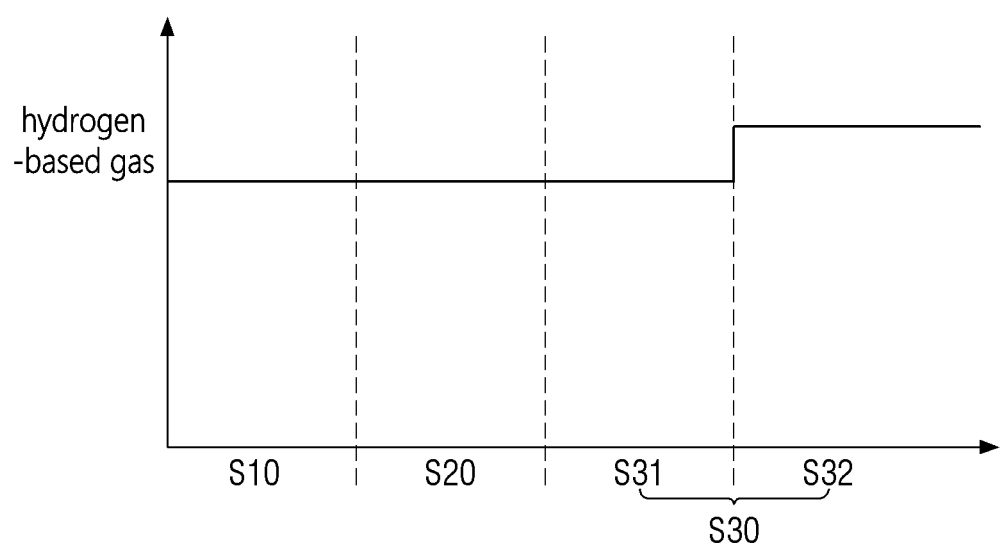

[FIG. 6]
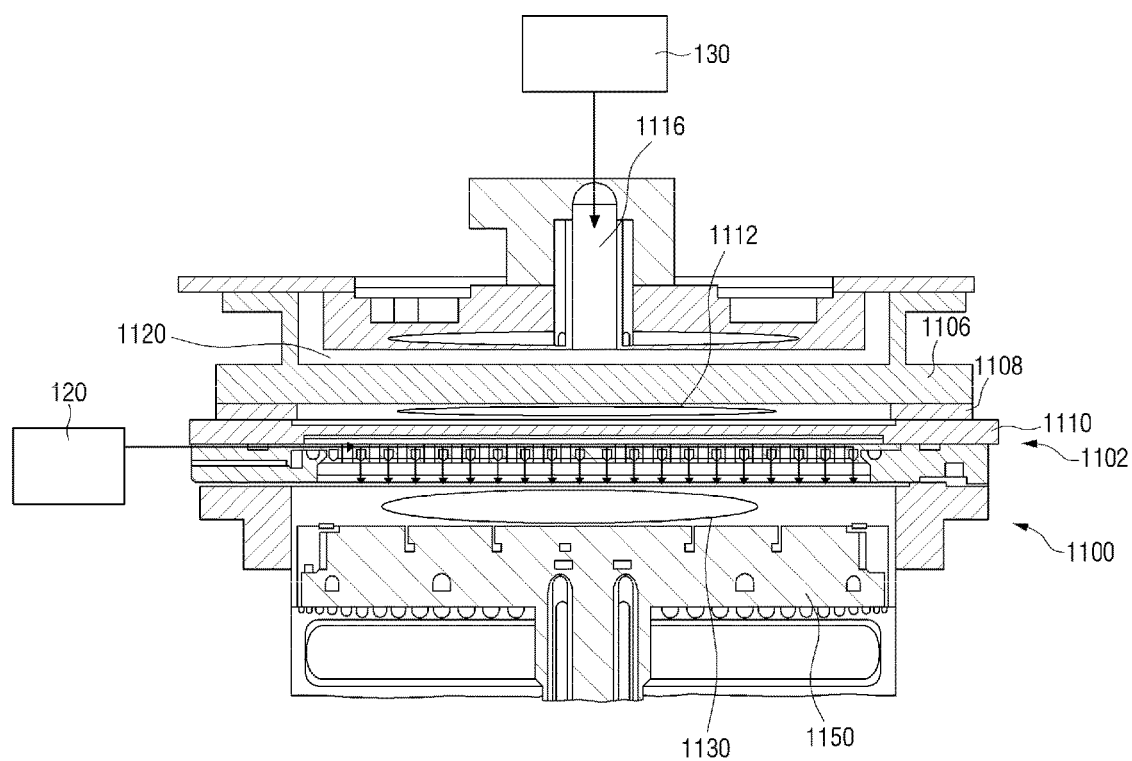

APPARATUS AND METHOD FOR PROCESSING SUBSTRATE

CROSS-REFERENCE TO RELATED APPLICATION

This application claims priority from Korean Patent Application No. 10-2019-0082207 filed on Jul. 8, 2019 in the Korean Intellectual Property Office, and all the benefits accruing therefrom under 35 U.S.C. 119, the contents of which in their entirety are herein incorporated by reference.

BACKGROUND

1. Technical Field

The present invention relates to an apparatus and a method for processing a substrate.

2. Description of the Related Art

When manufacturing a semiconductor device or a display device, a process of processing a substrate using plasma may be used. The process of processing the substrate using the plasma include a capacitively coupled plasma (CCP) method, an inductively coupled plasma (ICP) method, and a method in which the two are mixed depending on a method for generating plasma.

SUMMARY

In order to selectively remove silicon (e.g., polysilicon) compared to oxide (e.g., SiO2), plasma may be generated using a fluorine-based gas and a hydrogen-based gas. However, when a flow rate of a gas (e.g., a hydrogen-based gas) that affects the selection ratio is changed, the stability of the plasma may be deteriorated and a problem may occur in process reproducibility. This makes it difficult to expand the process margin.

Aspects of the present invention provide an apparatus for processing a substrate using plasma having high plasma stability and process reproducibility.

Aspects of the present invention also provide a method for processing a substrate using plasma having high plasma stability and process reproducibility.

However, aspects of the present invention are not restricted to those set forth herein. The above and other aspects of the present invention will become more apparent to one of ordinary skill in the art to which the present invention pertains by referencing the detailed description of the present invention given below.

An aspect of a method for processing a substrate of the present invention includes providing an apparatus for processing a substrate comprising a plasma generating region and a process region separate from the plasma generating region, placing the substrate including a silicon layer and an oxide layer in the process region, forming a hydrogen atmosphere in the process region by providing a hydrogen-based gas to the process region without passing through the plasma generating region, generating plasma by providing a fluorine-based gas to the plasma generating region, and providing the generated plasma to the process region to selectively remove the silicon layer compared to the oxide layer.

In addition, it may provide the hydrogen-based gas to the process region without passing through the plasma generating region during a period of generating the plasma, a period of selectively removing the silicon layer, and a predetermined period after removing the silicon layer.

Here, a flow rate of the hydrogen-based gas provided during a period of forming the hydrogen atmosphere, the period of generating the plasma, the period of selectively removing the silicon layer, and the predetermined period after removing the silicon layer may be constant.

In addition, selectively removing the silicon layer may include providing the hydrogen-based gas at a first flow rate during a first processing period, and providing the hydrogen-based gas at a second flow rate greater than the first flow rate during a second processing period after the first processing period.

In addition, it may provide the hydrogen-based gas at the first flow rate during the period of forming the hydrogen atmosphere and the period of generating the plasma.

In addition, the hydrogen-based gas may include hydrogen or ammonia, and the fluorine-based gas may include nitrogen trifluoride or carbon tetrafluoride.

An aspect of an apparatus for processing a substrate of the present invention includes: a plasma generating module including a plasma generating region and a first gas providing unit for providing a first gas to the plasma generating region, the plasma generating module using the first gas to generate plasma in the plasma generating region; a process region separated from the plasma generating region and where the substrate is processed; a support module arranged in the process region to support the substrate; and a second gas providing unit for providing a second gas to the process region without passing through the plasma generating region during a first period before the plasma is generated by the plasma generating module, during a processing period of processing the substrate using the plasma generated by the plasma generating module, and during a second period after the processing of the substrate is finished.

The first gas is a fluorine-based gas, and the second gas is a hydrogen-based gas.

The substrate may include a silicon layer and an oxide layer, in which the silicon layer may be selectively removed compared to the oxide layer by the generated plasma.

A flow rate of the second gas provided by the second gas providing unit may be constant during the first period before the plasma is generated, during the processing period of processing the substrate using the plasma generated by the plasma generating module, and during the second period after the processing of the substrate is finished.

The plasma generating module may generate the plasma by a capacitively coupled plasma (CCP) method or an inductively coupled plasma (ICP) method.

The second gas providing unit may include a gas injection member for providing the second gas to the process region, in which a temperature of the gas injection member and a temperature of the support module may be the same during the processing period of processing the substrate.

The temperature of the support module may be 100° C. or higher during the processing period of processing the substrate.

Another aspect of an apparatus for processing a substrate of the present invention includes: a plasma generating region; a process region separate from the plasma generating region; a support module arranged in the process region to support the substrate; a first gas providing unit for providing a fluorine-based gas for generating plasma in the plasma generating region; and a second gas providing unit for providing a hydrogen-based gas to the process region without passing through the plasma generating region, in which a substrate including a silicon layer and an oxide layer is placed on the support module, in which the second gas providing unit provides the hydrogen-based gas to the process region to form the process region in a hydrogen atmosphere, in which the first gas providing unit provides the fluorine-based gas to the plasma generating region to generate the plasma, and in which the generated plasma is provided to the process region, so that the silicon layer is selectively removed compared to the oxide layer.

Here, it may further include that the second gas providing unit provides the hydrogen-based gas to the process region without passing through the plasma generating region during a period of generating the plasma, a period of selectively removing the silicon layer, and a predetermined period after removing the silicon layer.

Other specific details of embodiments are included in the detailed description and drawings.

BRIEF DESCRIPTION OF THE DRAWINGS

The above and other aspects and features of the present invention will become more apparent by describing in detail exemplary embodiments thereof with reference to the attached drawings, in which:

FIG. 1 is a conceptual view for illustrating an apparatus for processing a substrate according to some embodiments of the present invention;

FIG. 2 is a flowchart for illustrating a method for processing a substrate according to some embodiments of the present invention;

FIG. 3 is a view for explaining an example of a method for providing a hydrogen-based gas;

FIG. 4 is an exemplary view for illustrating a substrate on which an oxide layer and a silicon layer are formed;

FIG. 5 is a view for illustrating another example of a method for providing a hydrogen-based gas; and FIG. 6 is a view for illustrating an apparatus for processing a substrate according to an embodiment of the present invention.

DETAILED DESCRIPTION OF THE EMBODIMENTS

Hereinafter, preferred embodiments of the present invention will be described in detail with reference to the accompanying drawings. Benefits and features of the present invention, and methods for achieving them will be clarified with reference to embodiments described below in detail together with the accompanying drawings. However, the present invention is not limited to the embodiments disclosed below, but may be implemented in various different forms. The embodiments are provided only to make the disclosure of the present invention complete, and to fully inform the scope of the invention to those skilled in the art to which the present invention pertains. The invention is only defined by the scope of the claims. Like reference numerals refer to like elements throughout the specification.

When it is referred that elements are "on" or "above" the other elements, it includes a case where other elements are interposed in the middle as well as directly above other elements. On the other hand, when it is referred that elements are "directly on" or "directly above" other elements, it indicates that there are no intervening elements or layers.

The spatially relative terms "below," "beneath," "lower," "above," "upper," or the like may be used to easily describe the correlation between one element and other elements as shown in the drawings. The spatially relative terms should be understood as terms including different directions of an element in use or operation in addition to the directions shown in the drawings. For example, if elements shown in the drawings are turned over, elements described as "below" or "beneath" of other elements may be placed "above" other elements. Accordingly, an exemplary term "below" may include both the directions below and above. Elements may also be oriented in different directions, so that the spatially relative terms may be interpreted depending on the orientation.

Although the first, second, or the like are used to describe various elements, components, and/or sections, it goes without saying that these elements, components, and/or sections are not limited by these terms. These terms are only used to distinguish one element, component, or section from other elements, components, or sections. Accordingly, it goes without saying that a first element, a first component, or a first section mentioned below may be a second element, a second component, or a second section within the technical spirit of the present invention.

The terms used herein are for the purpose of describing embodiments and are not intended to be limiting of the present invention. Herein, the singular also includes the plural unless specifically stated otherwise in the phrase. The terms "comprises" and/or "comprising" as used herein do not exclude the presence or addition of one or more other components, steps, operations, and/or elements mentioned.

Unless otherwise defined, all terms (including technical and scientific terms) used herein may be used in a sense that may be commonly understood by those of ordinary skill in the art. In addition, the terms defined in the commonly used dictionaries are not ideally or excessively interpreted unless they are specifically defined clearly.

Hereinafter, embodiments of the present invention will be described in detail with reference to the accompanying drawings. In the description with reference to the accompanying drawings, the same or corresponding components are assigned the same reference numbers regardless of drawing numbers, and redundant description thereof will be omitted.

FIG. 1 is a conceptual view for illustrating an apparatus for processing a substrate according to some embodiments of the present invention.

Referring to FIG. 1, the apparatus for processing the substrate according to some embodiments of the present invention may include a plasma generating module 110, in which the plasma generating module 110 may include a plasma generating region 101, a first gas providing unit 130, or the like. In addition, the apparatus for processing the substrate may further include a process region 102, a support module 90, and a second gas providing unit 120.

The first gas providing unit 130 provides a first gas for generating plasma to the plasma generating region 101. For example, the first gas may be a fluorine-based gas (e.g., nitrogen trifluoride or carbon tetrafluoride). As described below, the fluorine-based gas may be used to remove (etch, clean, etc.) the silicon layer. The first gas may be changed depending on the type of process (e.g., a material to be etched, a shape of an etching profile, etc.).

In addition, additionally, an inert gas may be provided together with the first gas to the plasma generating region 101. The inert gas may include, for example, Ar and He.

Although not clearly illustrated in FIG. 1, the plasma generating module 110 may generate plasma in a capacitively coupled plasma (CCP) method or an inductively coupled plasma (ICP) method.

When generating the plasma by the CCP method, for example, a region between an upper electrode connected to a high frequency (RF) power source and a lower electrode connected to a ground may be the plasma generating region 101. The first gas may be ionized into the plasma by using an electric field formed between the upper electrode and the lower electrode.

When the plasma is generated by the ICP method, for example, an induction electric field is formed in the plasma generating region 101 by an antenna (or coil) to which the high frequency power source is connected, and the first gas may be ionized into the plasma using the same.

In particular, the plasma generating region 101 is separated from the process region 102 from each other. In other words, the plasma generating module 110 may be a remote plasma method. Although not separately shown, for example, a gas injection member (i.e., a shower head) 122 may be arranged between the plasma generating region 101 and the process region 102. The gas injection member 122 is provided with a first hole (through hole), so that some of the plasma (specifically, radical species or uncharged neutral species) may move from the plasma generating region 101 to the process region 102.

The support module 90 is arranged in the process region 102 to support a substrate W. The support module 90 may be implemented in various ways, such as electro-static chuck (ESC), mechanical chuck, or vacuum chuck. The substrate W may include a silicon layer and an oxide layer (see FIG. 4).

An etching process or a cleaning process may be performed in the process region 102, but is not limited thereto. In other words, any process using plasma may be used in the process region 102.

The second gas providing unit 120 provides a second gas to the process region 102 without passing through the plasma generating region 101. For example, the gas injection member 122 is provided with a second hole for providing the second gas. The second gas providing unit 120 is directly provided to the process region 102 through the second hole of the gas injection member 122. For example, the second gas may be a hydrogen-based gas (e.g., including hydrogen or ammonia).

By controlling the amount of the hydrogen-based gas, it is possible to control an etch selectivity or etch rate between the silicon layer and the oxide layer. Specifically, the hydrogen-based gas is used to control a level of fluorine radicals. A hydrogen component of the hydrogen-based gas chemically bonds with the fluorine radical to generate hydrogen fluoride (HF), and a fluoride gas is exhausted out of a chamber. As a flow rate of the hydrogen-based gas increases, the silicon layer may be selectively removed more compared to the oxide layer. When the flow rate of the hydrogen-based gas becomes a certain flow rate (e.g., 1000 sccm) or more, the silicon layer is continuously etched, but the oxide layer may no longer be etched.

In addition, the hydrogen-based gas also serves to passivate the oxide layer. In other words, the hydrogen-based gas partially bonds with the oxide layer, making it difficult for the fluorine radical to contact the oxide layer. Therefore, when the flow rate of the hydrogen-based gas increases, the oxide layer is not etched well.

By controlling the flow rate of the hydrogen-based gas in this way, the etch selectivity between the silicon layer and the oxide layer may be stably controlled.

FIG. 2 is a flowchart for illustrating a method for processing a substrate according to some embodiments of the present invention. FIG. 3 is a view for explaining an example of a method for providing a hydrogen-based gas. FIG. 4 is a view for illustrating a substrate on which an oxide layer and a silicon layer are formed. The arrangement of the oxide layer and the silicon layer shown in FIG. 4 is merely exemplary, and the scope of rights is not limited thereto.

First, the apparatus for processing the substrate including the plasma generating region (see 101 in FIG. 1) and the process region separated from the plasma generating region 101 (see 102 in FIG. 1) is provided.

Referring to FIGS. 1 and 2, first, the substrate W including the silicon layer and the oxide layer is placed on the support module 90 in the process region 102 (S5). For example, as shown in FIG. 4, the substrate W may have a shape in which the silicon layer 220 and the oxide layer 210 are exposed and placed on the lower layer 201. The lower layer 201 may include at least one of Si, SiGe, SiO2, and SiN, but is not limited to a specific material layer. The silicon layer 220 may include, for example, polysilicon or amorphous silicon, and the oxide layer 210 may include, for example, SiO2, but is not limited thereto.

Subsequently, the hydrogen-based gas is provided to the process region 102 without passing through the plasma generating region 101 to form the process region 102 in the hydrogen atmosphere (S10).

Specifically, the hydrogen-based gas (e.g., a hydrogen gas) may be provided to the process region 102 through the second hole of the gas injection member 122. A heater may be installed in the gas injection member 122, and the gas injection member 122 may be maintained at a predetermined temperature (e.g., 100° C. or higher, preferably 100° C. to 200° C.) by the heater. Further, a temperature of the support module 90 may be a predetermined temperature (e.g., 100° C. or higher, preferably 100° C. to 200° C.).

The temperature of the gas injection member 122 and the temperature of the support module 90 may be substantially the same. The support module 90 is positioned below the process region 102, and the gas injection member 122 is positioned above the process region 102. Therefore, by maintaining the temperature of the support module 90 and the gas injection member 122 substantially the same, a temperature of the process region 102 may be controlled within a desired range.

As such, as the process region 102 becomes the hydrogen atmosphere, the exposed oxide layer 210 of the substrate W begins to be passivated by the hydrogen-based gas.

Subsequently, the fluorine-based gas is supplied to the plasma generating region 101 to generate the plasma (S20). As described above, the fluorine-based gas (e.g., nitrogen trifluoride) is provided to the plasma generating region 101 to generate the plasma by the CCP method or the ICP method.

The hydrogen-based gas is continuously provided to the process region 102 even during the period of generating the plasma, so that the exposed oxide layer 210 of the substrate W is passivated by the hydrogen-based gas.

Subsequently, the generated plasma is provided to the process region to selectively remove the silicon layer 220 compared to the oxide layer 210 (S30).

Specifically, the gas injection member 122 is provided with the first hole (through hole), so that some of the plasma (specifically, radical species or uncharged neutral species) is moved from the plasma generating region 101 to the process region 102. The silicon layer may be selectively removed compared to the oxide layer by a moved fluorine radical.

The hydrogen-based gas is continuously provided to the process region 102 even during the period of selectively removing the silicon layer (S30), so that the exposed oxide layer 210 of the substrate W may be passivated by the hydrogen-based gas.

The temperature of the gas injection member 122 and the temperature of the support module 90 may be substantially the same as each other even during the period of selectively removing the silicon layer (S30). By maintaining the temperature of the support module 90 and the gas injection member 122 substantially the same, the temperature of the process region 102 may be controlled within a desired range. Here, the temperature of the support module 90 and the gas injection member 122 may be a predetermined temperature (e.g., 100° C. or higher, preferably 100° C. to 200° C.).

Referring to FIG. 3, the hydrogen-based gas is provided to the process region 102 without passing through the plasma generating region 101 during a period in which the process region 102 is formed in the hydrogen atmosphere before the plasma is generated (S10, first period), a period of generating the plasma by the plasma generating module 110 (S20), and during a processing period of processing the substrate W using the generated plasma (that is, a period of selectively removing the silicon layer) (S30).

In particular, as shown in FIG. 3, the flow rate of the hydrogen-based gas provided during the period of forming the hydrogen atmosphere (S10), the period of generating the plasma (S20), and the period of selectively removing the silicon layer (S30) may be constant. For example, the flow rate of the hydrogen-based gas may be about 1000 sccm.

During the periods S10, S20, and S30, the temperature of the support module 90 and the temperature of the gas injection member 122 may also be kept constant.

After the period of processing the substrate using the plasma (i.e., the period of selectively removing the silicon layer) (S30), the fluorine radicals may remain in the process region 102. In order to remove the remaining fluorine radicals, the hydrogen-based gas may be further provided for a predetermined period (i.e., during a second period) after the period of selectively removing the silicon layer (S30). In order to stabilize the process, the flow rate of the hydrogen-based gas may be substantially the same as the flow rate (e.g., about 1000 sccm) provided in the previous steps (S10, S20, and S30). Hydrogen fluoride (HF) is generated by combining the hydrogen-based gas with the remaining fluorine radicals, and the generated hydrogen fluoride may be exhausted. For the stabilization of the process, during a predetermined period (i.e., during the second period) after the period of selectively removing the silicon layer (S30), the support module 90 and the gas injection member 122 may also be maintained at a predetermined temperature (e.g., 100° C. or higher, preferably 100° C. to 200° C.).

FIG. 5 is a view for illustrating another example of a method for providing a hydrogen-based gas. For convenience of description, descriptions using FIGS. 3 and 4 will be omitted.

Referring to FIG. 5, the hydrogen-based gas is provided at a first flow rate in the period of forming the hydrogen atmosphere (S10) and the period of generating the plasma (S20).

Subsequently, the substrate is processed using the plasma (S30). However, the period of processing the substrate using the plasma (i.e., the period of selectively removing the silicon layer) (S30) may include a first processing period (S31) and a second processing period (S32).

Specifically, the hydrogen-based gas may be provided at the first flow rate (e.g., about 1000 sccm) during the first processing period (S31), and the hydrogen-based gas may be provided at a second flow rate greater than the first flow rate (e.g., about 1200-1300 sccm) during the second processing period (S32) after the first processing period (S31).

For example, suppose that the lower layer 201 in FIG. 4 is the oxide layer. As the silicon layer 220 is removed during the first processing period (S31), the lower layer 201 may be exposed. In other words, although the silicon layer 220 has not been completely removed (e.g., the silicon layer 220 remains in a boundary portion between the lower layer 201 and the oxide layer 210, or a sidewall portion of the oxide layer 210), the lower layer 201 is partially exposed. Therefore, the flow rate of the hydrogen-based gas is additionally increased to prevent the exposed lower layer 201 from being etched. The increased hydrogen-based gas may passivate the exposed lower layer 201 quickly. By doing this, it is possible to protect the lower layer 201 while completely removing remaining silicon layer 220.

Even after the second processing period (S32) ends, the hydrogen-based gas may be continuously provided at the second flow rate for a predetermined time (second time) in order to remove remaining fluorine radicals.

Hereinafter, a case where the plasma generating module is implemented with the capacity coupled plasma (CCP) method will be described as an example. It may also be implemented in other forms, such as an inductively coupled plasma (ICP) method, a micro-wave plasma (MWP) method, an electron cyclotron resonance (ECR) plasma method, a surface wave plasma (SWP) method, a helicon wave plasma method, an electron beam (e-beam) plasma, or the like.

FIG. 6 is a view for illustrating an apparatus for processing a substrate according to an embodiment of the present invention. FIG. 6 is a case where it is implemented in the capacity coupled plasma (CCP) method.

Referring to FIG. 6, an apparatus for processing a substrate according to another embodiment of the present invention includes a CCP unit 1102, a processing chamber 1100, a gas inlet 1116, a plasma generating region 1112, a process region 1130, a support module 1150, etc. A control module controls the CCP unit 1102, the processing chamber 1100, a gas supply module 1114, the support module 1150, or the like for generating plasma and controlling a process. Here, the plasma generating region 1112 corresponds to the plasma generating region 101 of FIG. 1, and the process region 1130 corresponds to the process region 102 of FIG. 1.

Here, the CCP unit 1102 includes a lid 1106, a spacer 1108, and a grid electrode 1110. The plasma is formed in the plasma generating region 1112 between the lid 1106 and the grid electrode 1110. The lid 1106 is electrically connected to a first power source (e.g., a high-frequency power source). The grid electrode 1110 is electrically connected to a second power source (e.g., a ground power source). The lid 1106 and the grid electrode 1110 are electrically conductive electrodes that may be electrically biased with respect to each other. This is to generate a sufficiently strong magnetic field to ionize a gas introduced between the lid 1106 and the grid electrode 1110 into plasma.

The lid 1106 may include at least one of a gas box, a blocker plate, and a face plate. These multiple components may be mechanically/electrically connected directly or indirectly to function as a single electrode (top electrode). Or, it may be integrated.

The grid electrode 1110 may include an ion blocker plate, pass uncharged neutral species or radical species, and inhibit passage of ionically-charged species. In addition, the grid electrode 1110 includes a shower head (the gas injection member 122), so that the second gas (i.e., a hydrogen-based gas) provided from the second gas providing unit 120 is provided to the process region 1130. The ion blocker plate and the shower head may be mechanically/electrically connected directly or indirectly to function as a single electrode (lower electrode). Or, it may be integrated.

The spacer 1108 is provided between the lid 1106 and the grid electrode 1110, and is made of dielectric.

The first gas (i.e., a fluorine-based gas) supplied from the first gas providing unit 130 is moved to the plasma generating region 1112. Here, the gas may be used to strike the plasma, or it may hold the already formed plasma. In some embodiments, prior to moving downward through the gas inlet 1116 to the CCP unit 1102, plasma generating gases may already be at least partially converted to plasma excited species within a remote plasma system (not shown) positioned outside the processing chamber 1100. When the plasma excited species reaches within the plasma generating region 1112, the species may be further excited within the CCP unit 1102, or may pass through a plasma excitation region without additional excitation. In some operations, the degree of additional excitation provided by the CCP unit 1102 may vary over time depending on a substrate processing sequence and/or conditions.

In order to uniformly transfer the gas into the plasma generating region 1112, a plurality of holes are installed in the lid 1106. The lid 1106 and the grid electrode 1110 serve as an upper electrode and a lower electrode, respectively, to form the plasma. Due to power applied to the lid 1106, the electrically charged lid 1106 may promote uniform distribution of the plasma in the plasma generating region 1112. In order to form the plasma in the plasma generating region 1112, the spacer 1108 electrically insulates the lid 1106 from the grid electrode 1110.

The processing chamber 1100 may be connected to a lower portion of the CCP unit 1102. The processing region 1130 is positioned in the processing chamber 1100. In other words, the process region 1130 is arranged under the grid electrode 1110 of the CCP unit 1102. Within the process region 1130, uncharged neutral or radical species that have passed through the grid electrode (i.e., an ion blocker plate) among plasmas generated by the CCP unit 1102 are used in the process. The process region 1130 in the processing chamber 1100 may have an internal pressure different from an ambient pressure.

The support module 1150 for supporting the substrate used in the process is arranged in the process region 1130.

As described with reference to FIGS. 1 to 5, the plasma generating region 1112 is provided with the first gas (fluorine-based gas) to generate the plasma, and the second gas (hydrogen-based gas) is provided to the process region 1130 without passing through the plasma generating region 1112. The second gas may be provided to the process region 1130 during the period of forming the hydrogen atmosphere before generating the plasma, the period of generating the plasma, the period of selectively removing the silicon layer, and the predetermined period after removing the silicon layer.

The embodiments of the present invention have been described with reference to the accompanying drawings. However, it may be understood that those of ordinary skill in the art to which the present invention pertains may implement the present invention in other specific forms without changing its technical spirit or essential features. Therefore, it should be understood that the embodiments described above are exemplary in all respects and not restrictive.

| Reference Numeral | | | |
|---|---|---|---|
| 90: | support module | 101: | plasma generating region |
| 102: | process region | 110: | plasma generating module |
| 130: | first gas providing unit | 120: | second gas providing unit |

What is claimed is:

1. An apparatus for processing a substrate, comprising:
   a plasma generating module including a plasma generating region and a first gas providing unit for providing a first gas to the plasma generating region, the plasma generating module using the first gas to generate plasma in the plasma generating region;
   a process region separated from the plasma generating region and where the substrate is processed;
   a support module arranged in the process region to support the substrate;
   a second gas providing unit for providing a second gas to the process region without passing through the plasma generating region; and
   a control module programmed to control the plasma generating module and the second gas providing unit,
   wherein the second gas providing unit comprises a gas injection member for providing the second gas to the process region, the gas injection member comprising a heater installed therein and configured to heat the gas injection member to a predetermined temperature,
   wherein the control module is programmed to control the second gas providing unit during a first period of forming a second gas atmosphere, a second period of generating the plasma, a third period of processing the substrate using the plasma, and a fourth period after the processing to remove first gas,
   wherein the control module is programmed to control the plasma generating module to generate plasma during the second period and the third period using first gas,
   wherein the third period includes a first processing period and a second processing period, and
   wherein the second gas providing unit is programmed to provide the second gas at a first flow rate during the first period, the second period and the first processing period, and at a second flow rate greater than the first flow rate during the second processing period and a fourth period.

2. The apparatus of claim 1, wherein the first gas is a fluorine-based gas, and the second gas is a hydrogen-based gas.

3. The apparatus of claim 2, wherein the substrate comprises a silicon layer and an oxide layer, and
   wherein the silicon layer is selectively removed compared to the oxide layer by the generated plasma.

4. The apparatus of claim 1, wherein the plasma generating module generates the plasma by a capacitively coupled plasma (CCP) method or an inductively coupled plasma (ICP) method.

5. The apparatus of claim 1, wherein the control module controls the predetermined temperature of the gas injection member and a temperature of the support module to be the same during the third period of processing the substrate.

6. The apparatus of claim 5, wherein the temperature of the support module is 100° C. or higher during the third period of processing the substrate.

7. An apparatus for processing a substrate, comprising:
   a plasma generating region;
   a process region separate from the plasma generating region;

a support module arranged in the process region to support the substrate:

a first gas providing unit for providing a fluorine-based gas for generating plasma in the plasma generating region;

a second gas providing unit for providing a hydrogen-based gas to the process region without passing through the plasma generating region; and a control module programmed to control the plasma generating module and the second gas providing unit, wherein a substrate including a silicon layer and an oxide layer is placed on the support module, wherein the second gas providing unit provides the hydrogen-based gas to the process region to form the process region in a hydrogen atmosphere, wherein the first gas providing unit provides the fluorine-based gas to the plasma generating region to generate the plasma, wherein the generated plasma is provided to the process region, so that the silicon layer is selectively removed compared to the oxide layer, wherein the second gas providing unit comprises a gas injection member for providing the second gas to the process region, the gas injection member comprising a heater installed therein and configured to heat the gas injection member to a predetermined temperature, wherein the control module is programmed to control the second gas providing unit during a first period of forming a second gas atmosphere, a second period of generating the plasma, a third period of processing the substrate using the plasma, and a fourth period after processing the substrate to remove first gas;

wherein the control module is programmed to control the plasma generating module to generate plasma during the second period and the third period, wherein the third period includes a first processing period and a second processing period, and wherein the second gas providing unit is programmed to provide the second gas at a first flow rate during the first period, the second period and the first processing period, and at a second flow rate greater than the first flow rate during the second processing period and the fourth period.

8. The apparatus of claim 7, wherein the second gas providing unit provides the hydrogen-based gas to the process region without passing through the plasma generating region during a period of generating the plasma, a period of selectively removing the silicon layer, and a predetermined period after removing the silicon layer.

* * * * *

UNITED STATES PATENT AND TRADEMARK OFFICE
CERTIFICATE OF CORRECTION

PATENT NO. : 12,327,735 B2
APPLICATION NO. : 16/918212
DATED : June 10, 2025
INVENTOR(S) : Seong Gil Lee et al.

Page 1 of 1

It is certified that error appears in the above-identified patent and that said Letters Patent is hereby corrected as shown below:

In the Claims

In Column 11, Line 2 in Claim 7 the word "substrate:" should read -- substrate; --.

Signed and Sealed this
Fourteenth Day of October, 2025

John A. Squires
*Director of the United States Patent and Trademark Office*